US008797118B2

(12) United States Patent
Urano et al.

(10) Patent No.: US 8,797,118 B2
(45) Date of Patent: Aug. 5, 2014

(54) PASSIVE COMPONENT

(75) Inventors: Masaki Urano, Saku (JP); Hirotaka Takeuchi, Saku (JP)

(73) Assignee: Soshin Electric Co., Ltd., Saku (JP)

( * ) Notice: Subject to any disclaimer, the term of this patent is extended or adjusted under 35 U.S.C. 154(b) by 526 days.

(21) Appl. No.: 13/062,853

(22) PCT Filed: Sep. 28, 2009

(86) PCT No.: PCT/JP2009/066783
§ 371 (c)(1), (2), (4) Date: Mar. 8, 2011

(87) PCT Pub. No.: WO2010/035830
PCT Pub. Date: Apr. 1, 2010

(65) Prior Publication Data
US 2011/0163825 A1 Jul. 7, 2011

(30) Foreign Application Priority Data
Sep. 29, 2008 (JP) ................................. 2008-250086

(51) Int. Cl.
*H03H 5/00* (2006.01)
*H01P 1/20* (2006.01)

(52) U.S. Cl.
USPC ............................................ 333/26; 333/202

(58) Field of Classification Search
USPC ..................................... 333/25, 26, 202, 204
See application file for complete search history.

(56) References Cited

U.S. PATENT DOCUMENTS

| | | | | |
|---|---|---|---|---|
| 5,644,272 | A | 7/1997 | Dabrowski | |
| 6,683,510 | B1 * | 1/2004 | Padilla | 333/25 |
| 6,788,164 | B2 | 9/2004 | Maekawa et al. | |
| 6,828,881 | B2 | 12/2004 | Mizutani et al. | |
| 7,126,444 | B2 | 10/2006 | Fukunaga et al. | |
| 7,250,828 | B2 * | 7/2007 | Erb | 333/26 |
| 7,256,663 | B2 * | 8/2007 | Yasuda et al. | 333/26 |
| 7,479,850 | B2 | 1/2009 | Kearns et al. | |
| 7,528,676 | B2 * | 5/2009 | Kearns et al. | 333/26 |
| 7,548,141 | B2 | 6/2009 | Matsubara et al. | |
| 7,800,465 | B2 * | 9/2010 | Kimura et al. | 333/204 |
| 2007/0152780 | A1 | 7/2007 | Liao et al. | |

FOREIGN PATENT DOCUMENTS

| | | | |
|---|---|---|---|
| JP | 2000-506344 | A1 | 5/2000 |
| JP | 2002-299127 | A1 | 10/2002 |
| JP | 2003-069360 | A1 | 3/2003 |
| JP | 2003-087008 | A1 | 3/2003 |
| JP | 2004-056745 | A1 | 2/2004 |
| JP | 2004-349862 | A1 | 12/2004 |
| JP | 2005-045447 | A1 | 2/2005 |

(Continued)

OTHER PUBLICATIONS

Japanese Office Action dated Apr. 9, 2013 (with English translation).

*Primary Examiner* — Dean O Takaoka
(74) *Attorney, Agent, or Firm* — Burr & Brown, PLLC

(57) ABSTRACT

A first passive component includes one unbalanced line having one unbalance input terminal, one balanced line installed opposite to the unbalanced line and having two balanced output terminals (first balanced output terminal and second balanced output terminal), and a capacitor formed between the balanced line and a fixed potential (e.g. the ground potential). Furthermore, the relation d1>d2 is satisfied, where d1 is the physical length of the unbalanced line and d2 is the physical length of the balanced line.

13 Claims, 19 Drawing Sheets

(56) References Cited

FOREIGN PATENT DOCUMENTS

| | | | |
|---|---|---|---|
| JP | 2005-080248 | A1 | 3/2005 |
| JP | 3123562 | U1 | 7/2006 |
| JP | 2007-189563 | A1 | 7/2007 |
| JP | 2007-282231 | A1 | 10/2007 |

* cited by examiner

PASSIVE COMPONENT

BACKGROUND OF THE INVENTION

1. Field of the Invention

The present invention relates to a passive component, and more particularly to a passive component suitable for use in an unbalanced to balanced converting circuit for converting an unbalanced input signal into a balanced output signal or for use in a composite circuit which includes a filter having at least one resonator and an unbalanced to balanced converting circuit.

2. Description of Related Art

Generally, there is known a balun transformer (unbalanced to balanced converter) as a circuit component for converting an unbalanced input signal into a balanced output signal or converting a balanced input signal into an unbalanced output signal.

Recently, semiconductor components such as integrated circuits (ICs) or the like have been highly integrated, while semiconductor components have quickly become smaller in their size. Accordingly, balun transformers have also become smaller in size.

One conventional balun transformer has a ½-wavelength unbalanced transmission line and a pair of ¼-wavelength balanced transmission lines (see Japanese Laid-Open Patent Publication No. 2002-299127).

The unbalanced transmission line has an end serving as an unbalanced input terminal of the balun transformer and the other end serving as an open end. Each of the balanced transmission lines has an end serving as a balanced output terminal of the balun transformer and the other end connected to ground.

Conventional passive components incorporating such a balun transformer are disclosed in Japanese Laid-Open Patent Publication No. 2004-056745 and Japanese Laid-Open Patent Publication No. 2003-087008.

The passive component disclosed in Japanese Laid-Open Patent Publication No. 2004-056745 is a high-frequency component incorporating a balun and a filter. The disclosed passive component includes a balun for converting a balanced line signal into an unbalanced line signal and vice versa, and a filter electrically connected to the balun, for passing or attenuating a certain frequency component. The disclosed passive component has an electrode layer which provides electrode patterns of the balun and the filter, and a dielectric layer. The electrode layer and the dielectric layer are stacked into an integral assembly.

The passive component disclosed in Japanese Laid-Open Patent Publication No. 2003-087008 includes, within a dielectric substrate, a filter section having input resonant electrodes and output resonant electrodes of two ¼-wavelength resonators, a converter having a plurality of striplines, and a connector which connects the filter section and the converter to each other.

A passive component disclosed in Japanese Laid-Open Patent Publication No. 2005-080248 is a stacked bandpass filter which is capable of outputting a balanced signal and which is small in size and can easily be adjusted. The disclosed passive component includes an unbalanced input terminal, a balanced output terminal, and a bandpass filter section connected between the unbalanced input terminal and the balanced output terminal. The bandpass filter section has a multilayer substrate on which a plurality of resonators comprising respective TEM lines are integrated. The bandpass filter section has resonators including an input resonator and a balanced-output ½-wavelength resonator which comprises a double-open-ended ½-wavelength resonator. The unbalanced input terminal is connected to the input resonator through a capacitor, and the balanced output terminal is connected to the balanced-output ½-wavelength resonator through a capacitor.

Although the passive components disclosed in Japanese Laid-Open Patent Publication No. 2004-056745 and Japanese Laid-Open Patent Publication No. 2003-087008 have the filter and the balun integrally combined with each other by the multilayer substrate or the dielectric substrate, since filter and the balun are separate circuits, the number of parts is so large that a circuit including the bandpass filter and the balun causes a large loss and has a large size.

In the stacked bandpass filter disclosed in Japanese Laid-Open Patent Publication No. 2005-080248, on the other hand, the two balanced output terminals are connected to the balanced-output ½-wavelength resonator which comprises a double-open-ended ½-wavelength resonator. Therefore, the stacked bandpass filter is capable of outputting balanced signals from the two balanced output terminals without using a balun.

SUMMARY OF THE INVENTION

However, the stacked bandpass filter disclosed in Japanese Laid-Open Patent Publication No. 2005-080248 is problematic in that it suffers a low degree of design freedom.

Specifically, FIGS. 1, 5, 8, 11, 15 of Japanese Laid-Open Patent Publication No. 2005-080248 disclose that an output resonator and a resonator adjacent thereto comprise λ/2 resonators, respectively, and these resonators have the same physical length. FIG. 13 thereof discloses that an output resonator comprises a λ/2 resonator, a resonator adjacent thereto comprises a λ/4 resonator, and the physical length of the output resonator is twice the physical length of the adjacent resonator. FIGS. 21 and 24 through 30 thereof disclose that an output resonator comprises two λ/4 resonators and a resonator adjacent thereto comprises a λ/2 resonator.

As can be understood from the disclosed arrangements, according to the example in which the output resonator has an electrical length λ/2, if the resonator adjacent thereto has an electrical length λ/2, then their physical lengths have to be the same as each other, or if the resonator adjacent thereto has an electrical length λ/4, then the physical length of the output resonator has to be twice the physical length of the adjacent resonator. Therefore, the degree of design freedom is limited. Accordingly, the disclosed stacked bandpass filter may not be able to meet various requirements. Even if the disclosed stacked bandpass filter can meet various requirements, it suffers problems in that it causes a large loss and has a large size.

Furthermore, as disclosed in Japanese Laid-Open Patent Publication No. 2002-299127, Japanese Laid-Open Patent Publication No. 2004-056745, and Japanese Laid-Open Patent Publication No. 2003-087008, the electromagnetic coupling between the unbalanced transmission line and the pair of balanced transmission lines tends to suffer characteristic degradations because no electromagnetic coupling is provided between the balanced transmission lines.

The present invention has been made in view of the above problems. It is an object of the present invention to provide a passive component which allows the physical length of a balanced line to be smaller than the physical length of an unbalanced line even if the electrical length of each of the unbalanced line and the balanced line is λ/2, or which allows the physical lengths of an unbalanced line and a balanced line to be the same as each other even if the electrical lengths of the unbalanced line and the balanced line are different from each other, so that an unbalanced to balanced converter can be designed with an increased degree of freedom.

Another object of the present invention is to provide a passive component which allows one of resonant electrodes to double as an unbalanced line of an unbalanced to balanced converter, which allows the physical length of a balanced line to be smaller than the physical length of an unbalanced line even if the electrical length of each of the unbalanced line and the balanced line is λ/2, or which allows the physical lengths of an unbalanced line and a balanced line to be the same as each other even if the electrical lengths of the unbalanced line and the balanced line are different from each other, so that the passive component which has a filter section and unbalanced to balanced converter in integral combination can effectively be designed with an increased degree of freedom, effectively has a reduced size, and effectively reduces the loss which it causes.

A passive component according to a first invention includes an unbalanced line, a balanced line disposed in confronting relation to the unbalanced line, and a capacitor occurring between the balanced line and a fixed potential.

The passive component may be designed in various modes. For example, even if each of the unbalanced line and the balanced line has an electrical length λ/2, the physical length of the balanced line can be made smaller than the physical length of the unbalanced line. Alternatively, even if the unbalanced line and the balanced line have different electrical lengths, the physical lengths of the unbalanced line and the balanced line can be made equal to each other. Therefore, an unbalanced to balanced converter can be designed with an increased degree of freedom. Unlike Japanese Laid-Open Patent Publication No. 2002-299127, Japanese Laid-Open Patent Publication No. 2004-056745, and Japanese Laid-Open Patent Publication No. 2003-087008, since one balanced line is disposed in confronting relation to one unbalanced line, the balanced line includes nothing that cannot be electromagnetically coupled. Consequently, the passive component is free of characteristics degradations.

In the first invention, the unbalanced line has a physical length d1 and the balanced line has a physical length d2, and the physical lengths (d1, d2) may be related to each other as follows:

$$d1>d2$$

Alternatively, the unbalanced line may have an electrical length λ/4 and the balanced line may have an electrical length λ/2.

In the first invention, the passive component may further include a dielectric substrate with an upper shield electrode and/or a lower shield electrode disposed thereon, a first stripline electrode disposed in the dielectric substrate and serving as the unbalanced line, a second stripline electrode disposed in the dielectric substrate and serving as the balanced line, and a capacitor-forming electrode disposed in the dielectric substrate and forming the capacitor between itself and the second stripline electrode, wherein the capacitor-forming electrode may be connected to the second stripline electrode at a position adjusted for the phase difference and balanced characteristics of balanced output.

In the first invention, the first stripline electrode and the second stripline electrode may be disposed on different surfaces, respectively, or may be disposed on one surface.

In the first invention, the capacitor-forming electrode may be disposed between the second stripline electrode and the upper shield electrode or the lower shield electrode in confronting relation to the second stripline electrode and the upper shield electrode or the lower shield electrode, and the fixed potential may comprise a ground potential.

In the first invention, the capacitor-forming electrode may be disposed between the second stripline electrode and the upper shield electrode or the lower shield electrode in confronting relation to the second stripline electrode and the upper shield electrode or the lower shield electrode, and may be clamped to a DC potential different from a ground potential, and the fixed potential may comprise the DC potential.

A passive component according to a second invention includes a filter section having at least one resonator, and an unbalanced to balanced converter for converting an unbalanced output signal from at least the filter section into a balanced output signal, wherein the unbalanced to balanced converter includes a resonator of the filter section, a balanced line disposed in confronting relation to the resonator, and a capacitor occurring between the balanced line and a fixed potential.

With the above arrangement, one resonance electrode can also function as an unbalanced line of the unbalanced to balanced converter. The passive component may be designed in various modes. For example, even if each of an unbalanced line and the balanced line has an electrical length λ/2, the physical length of the balanced line can be made smaller than the physical length of the unbalanced line. Alternatively, even if the unbalanced line and the balanced line have different electrical lengths, the physical lengths of the unbalanced line and the balanced line can be made equal to each other. Therefore, the passive component which includes the filter section and the unbalanced to balanced converter can be designed with an increased degree of freedom, can be reduced in size, and can reduce the loss which it causes.

In the second invention, the resonator includes an unbalanced line having a physical length d1 and the balanced line has a physical length d2, and the physical lengths (d1, d2) may be related to each other as follows:

$$d1>d2$$

Alternatively, the resonator may include an unbalanced line having an electrical length λ/4 and the balanced line may have an electrical length λ/2.

In the second invention, the passive component may further includes a dielectric substrate with an upper shield electrode and/or a lower shield electrode disposed thereon, a resonance electrode of the resonator which is disposed in the dielectric substrate, a stripline electrode disposed in the dielectric substrate and serving as the balanced line, and a capacitor-forming electrode disposed in the dielectric substrate and forming the capacitor between itself and the stripline electrode, wherein the capacitor-forming electrode may be connected to the stripline electrode at a position adjusted for the phase difference and balanced characteristics of balanced output.

In the second invention, the resonance electrode and the stripline electrode may be disposed on different surfaces, respectively, or may be disposed on one surface.

In the second invention, the capacitor-forming electrode may be disposed between the stripline electrode and the upper shield electrode or the lower shield electrode in confronting relation to the stripline electrode and the upper shield electrode or the lower shield electrode, and the fixed potential may comprise a ground potential.

In the second invention, the capacitor-forming electrode may be disposed between the stripline electrode and the upper shield electrode or the lower shield electrode in confronting relation to the stripline electrode and the upper shield electrode or the lower shield electrode, and may be clamped to a DC potential different from a ground potential, and the fixed potential may comprise the DC potential.

As described above, the passive component according to the present invention may be designed in various modes. For example, even if each of the unbalanced line and the balanced line has an electrical length λ/2, the physical length of the balanced line can be made smaller than the physical length of the unbalanced line. Alternatively, even if the unbalanced line and the balanced line have different electrical lengths, the physical lengths of the unbalanced line and the balanced line can be made equal to each other. Therefore, the unbalanced to balanced converter can be designed with an increased degree of freedom.

With the passive component according to the present invention, furthermore, one resonance electrode can also function as the unbalanced line of the unbalanced to balanced converter. The passive component may be designed in various modes. For example, even if each of an unbalanced line and the balanced line has an electrical length λ/2, the physical length of the balanced line can be made smaller than the physical length of the unbalanced line. Alternatively, even if the unbalanced line and the balanced line have different electrical lengths, the physical lengths of the unbalanced line and the balanced line can be made equal to each other. Therefore, the passive component which includes the filter section and the unbalanced to balanced converter can be designed with an increased degree of freedom, can be reduced in size, and can reduce the loss which it causes.

DETAILED DESCRIPTION OF THE INVENTION

Passive components according to exemplary embodiments of the present invention will be described below with reference to FIGS. 1 through 19.

Figure 1:
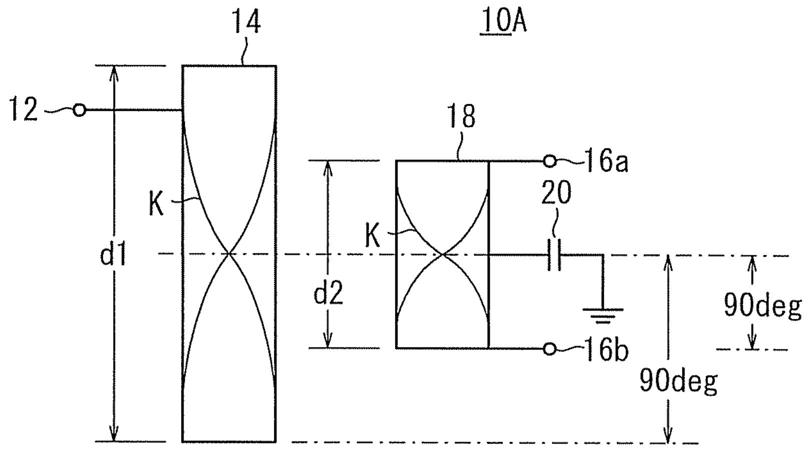
FIG. 1 is a view showing a first passive component.

As shown in FIG. 1, a passive component according to a first exemplary embodiment (hereinafter referred to as "first passive component 10A") includes an unbalanced line 14 having an unbalanced input terminal 12, a balanced line 18 disposed in confronting relation to the unbalanced line 14 and having two balanced output terminals (a first balanced output terminal 16*a* and a second balanced output terminal 16*b*), and a capacitor 20 occurring between the balanced line 18 and a fixed potential (e.g., a ground potential).

In the first passive component 10A, if the unbalanced line 14 has a physical length d1 and the balanced line 18 has a physical length d2, then the physical lengths d1, d2 are related to each other as follows:

$$d1>d2$$

In the example shown in FIG. 1, the fixed potential is represented by the ground potential. However, the fixed potential may be any desired DC potential.

Operation of the first passive component 10A will be described with reference to FIGS. 2A through 3 in comparison with a passive component 300 according to a comparative example.

The passive component 300 according to the comparative example includes an unbalanced line 304 having an unbalanced input terminal 302 and a balanced line 308 disposed in confronting relation to the unbalanced line 304 and having two balanced output terminals 306*a*, 306*b*. If the unbalanced line 304 has a physical length d1 and the balanced line 308 has a physical length d2, then the physical lengths d1, d2 are related to each other as follows:

$$d1=d2$$

Each of the unbalanced line 304 and the balanced line 308 has an electrical length λ/2. The passive component 300 is free of the capacitor 20 of the first passive component 10A.

Specifically, according to the comparative example, the unbalanced line 304 has an electric field distribution K such that there is no electric field at the longitudinal center of the unbalanced line 304 and there are maximum electric fields at the both ends of the unbalanced line 304. In order for the balanced line 308 to have the same electric field distribution K, the physical length of the balanced line 308 is made equal to the physical length of the unbalanced line 304. With this arrangement, the two balanced output terminals 306*a*, 306*b* output signals whose phase difference is of 180 degrees.

Figure 2A:
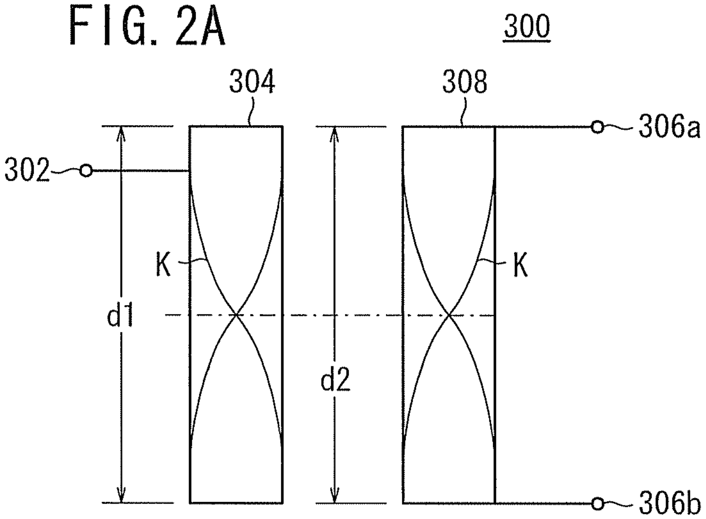
FIG. 2A is a view showing a passive component according to a comparative example.
Figure 2B:
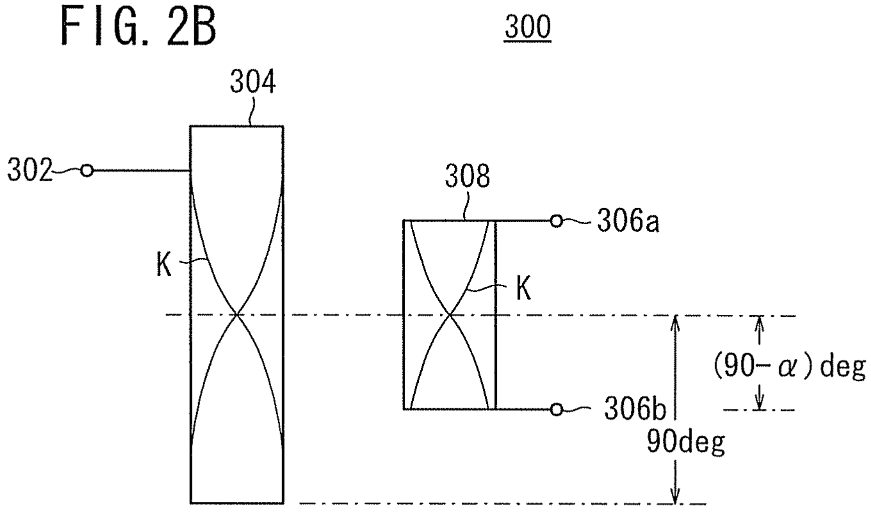
FIG. 2B is view showing a passive component according to a comparative example with a shortened balanced line.

If the physical length d2 of the balanced line 308 is made shorter than the physical length d1 of the unbalanced line 304, as shown in FIG. 2B, for example, by shortening the both ends of the balanced line 308 by a phase of α degrees, then the electric field distribution K of the balanced line 308 is such that there is no electric field at the longitudinal center of the balanced line 308 and there are no maximum electric fields at the both ends of the balanced line 308. Accordingly, the phase difference between the signals output from the two balanced output terminals 306*a*, 306*b* is not of 180 degrees, but of $(180-2\times\alpha)$ degrees deviating from the prescribed value of 180 degrees.

According to the comparative example, in order to provide the phase difference of 180 degrees between the signals output from the two balanced output terminals 306*a*, 306*b*, it is essential to make the physical length d2 of the balanced line 308 equal to the physical length d1 of the unbalanced line 304. Therefore, it will be seen that the passive component 300 according to the comparative example has almost no design freedom.

With the first passive component 10A, on the other hand, by appropriately setting the value of the capacitor 20 occurring between the balanced line 18 and the fixed potential, even if the physical length d2 of the balanced line 308 is smaller than the physical length d1 of the unbalanced line 304, the balanced line 18 has an electric field distribution K such that there is no electric field at the longitudinal center of the balanced line 18 and there are maximum electric fields at the both ends of the balanced line 18. Specifically, by appropriately setting the value of the capacitor 20, the resonant frequency of the balanced line 18 is changed and hence the phase is changed, making it possible to provide a phase difference of 180 degrees between signals output from the first balanced output terminal 16*a* and the second balanced output terminal 16*b*.

An experimental example will be illustrated below. The experimental example was conducted to observe changes in the phase difference depending on the frequency if the physical length d2 of the balanced line is made smaller in the passive component 300 according to the comparative example and the passive component (the first passive component 10A) according to the exemplary embodiment. The results of the experimental example are shown in FIG. 3.

Figure 3:
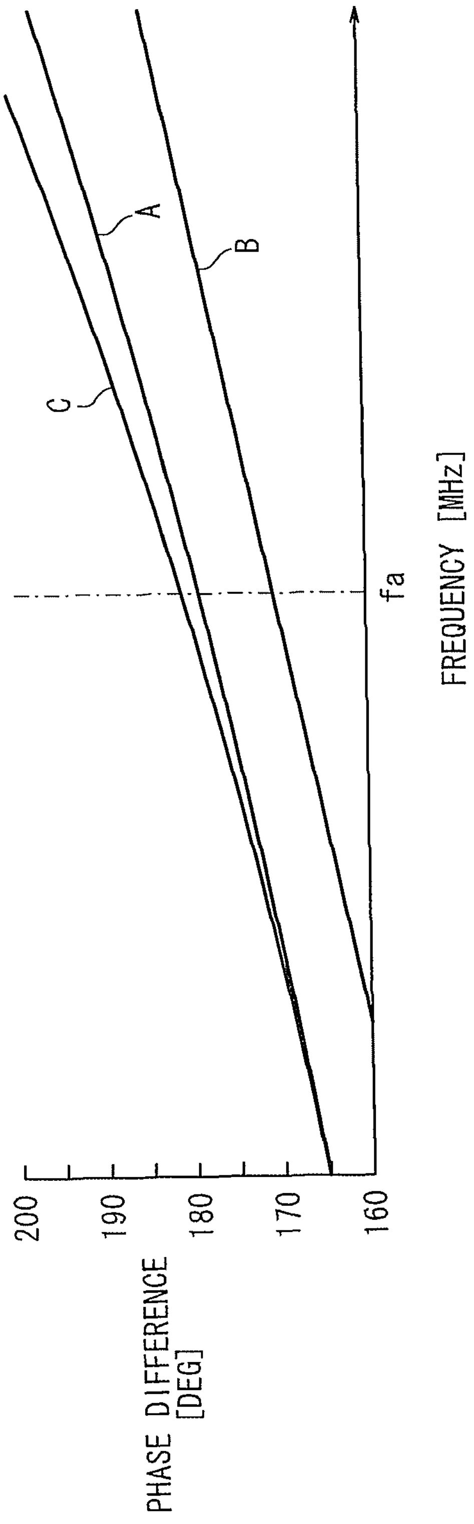
FIG. 3 is a characteristic diagram showing changes in the phase difference depending on the frequency of the inventive and comparative examples.

In FIG. 3, the curve A represents the characteristics of the passive component 300 according to the comparative example shown in FIG. 2A, indicating the prescribed phase difference of 180 degrees at a central frequency fa. The curve B represents the characteristics of the passive component 300 according to the comparative example shown in FIG. 2B, indicating a phase difference of 170 degrees, smaller than the prescribed phase difference of 180 degrees, at the central frequency fa. The phase difference of 170 degrees results from the smaller physical length d2 of the balanced line 308.

With the passive component (the first passive component 10A) according to the exemplary embodiment, as indicated by the curve C in FIG. 3, it is possible to adjust the phase difference at the central frequency fa to the prescribed 180 degrees by appropriately varying the value of the capacitor 20 even if the physical length d2 of the balanced line 18 is smaller.

With the first passive component 10A, therefore, even if the physical length d2 of the balanced line 18 is smaller than the physical length d1 of the unbalanced line 14, the balanced characteristics of the balanced output signals can easily be controlled by appropriately setting the value of the capacitor 20. As a consequence, it is possible to increase the degree of design freedom of the first passive component 10A.

Figure 4:
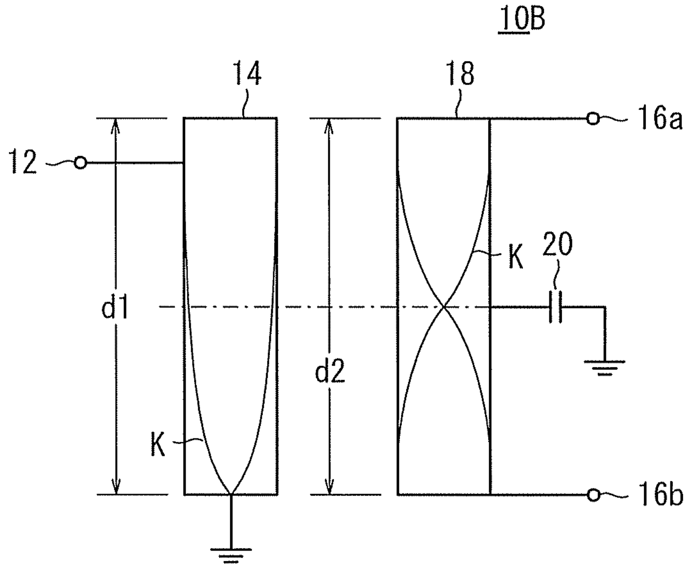
FIG. 4 is a view showing a second passive component.

As shown in FIG. 4, a passive component according to a second exemplary embodiment (hereinafter referred to as "second passive component 10B") is substantially identical in structure to the first passive component 10A, but is different therefrom in that the unbalanced line 14 has an electrical length λ/4 and the physical length d2 of the balanced line 18 is substantially the same as the physical length d1 of the unbalanced line 14.

With the second passive component 10B, the unbalanced line 14 has an electric field distribution K such that there is no electric field at a short-circuited end of the unbalanced line 14 and there is a maximum electric field at an open end of the unbalanced line 14. With the second passive component 10B, by appropriately setting the value of the capacitor 20 occurring between the balanced line 18 and the fixed potential, even if the physical length d2 of the balanced line 18 is substantially the same as the physical length d1 of the unbalanced line 14, the balanced line 18 has an electric field distribution K such that there is no electric field at the longitudinal center of the balanced line 18 and there are maximum electric fields at the both ends of the balanced line 18. Specifically, it is possible to provide a phase difference of 180 degrees between signals output from the first balanced output terminal 16*a* and the second balanced output terminal 16*b*.

Furthermore, even if the physical lengths of the unbalanced line 14 and the balanced line 18 are the same as each other in design, they actually tend to be different from each other due to manufacturing variations, thus degrading balanced characteristics of the balanced output. In other words, the phase difference may not be of 180 degrees. Even in such a case, the manufacturing variations may be absorbed by appropriately setting the value of the capacitor, thereby increasing the yield (increasing the productivity) of second passive components 10B. This leads to a reduction in the cost of the second passive component 10B.

A passive component according to a third exemplary embodiment (hereinafter referred to as "third passive component 10C") will be described below with reference to FIG. 5.

Figure 5:
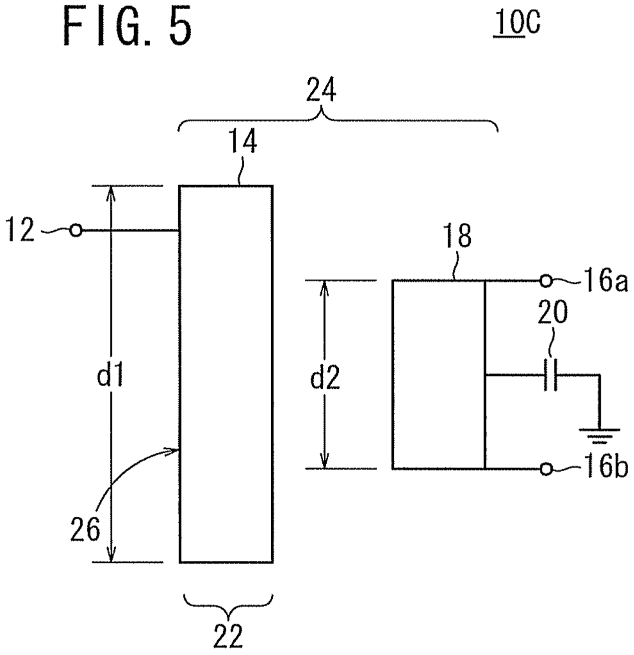
FIG. 5 is a view showing a third passive component.

As shown in FIG. 5, the third passive component 10C is substantially identical in structure to the first passive component 10A, but is different therefrom in that it includes a filter section 22 and a balun 24.

The filter section 22 includes a resonator 26 having an unbalanced input terminal 12. The resonator 26 comprises an unbalanced line 14 having an electrical length λ/2.

The balun 24 includes the unbalanced line 14 of the resonator 26 of the filter section 22, a balanced line 18 disposed in confronting relation to the unbalanced line 14, and a capacitor 20 occurring between the balanced line 18 and the fixed potential.

In the third passive component 10C, if the unbalanced line 14 has a physical length d1 and the balanced line 18 has a physical length d2, then the physical lengths d1, d2 are related to each other as follows:

$$d1>d2$$

With the third passive component 10C, it is possible to provide a phase difference of 180 degrees between signals output from the first balanced output terminal 16*a* and the second balanced output terminal 16*b*. Furthermore, since the resonator 26 of the filter section 22 can also function as the unbalanced line 14 of the balun 24, the third passive component 10C is reduced in size.

The third passive component 10C makes it possible to effectively increase the degree of design freedom, reduce the size, and reduce the loss, of a passive component which includes the filter section 22 and the balun 24 in integral combination.

A passive component according to a fourth exemplary embodiment (hereinafter referred to as "fourth passive component 10D") will be described below with reference to FIG. 6.

Figure 6:
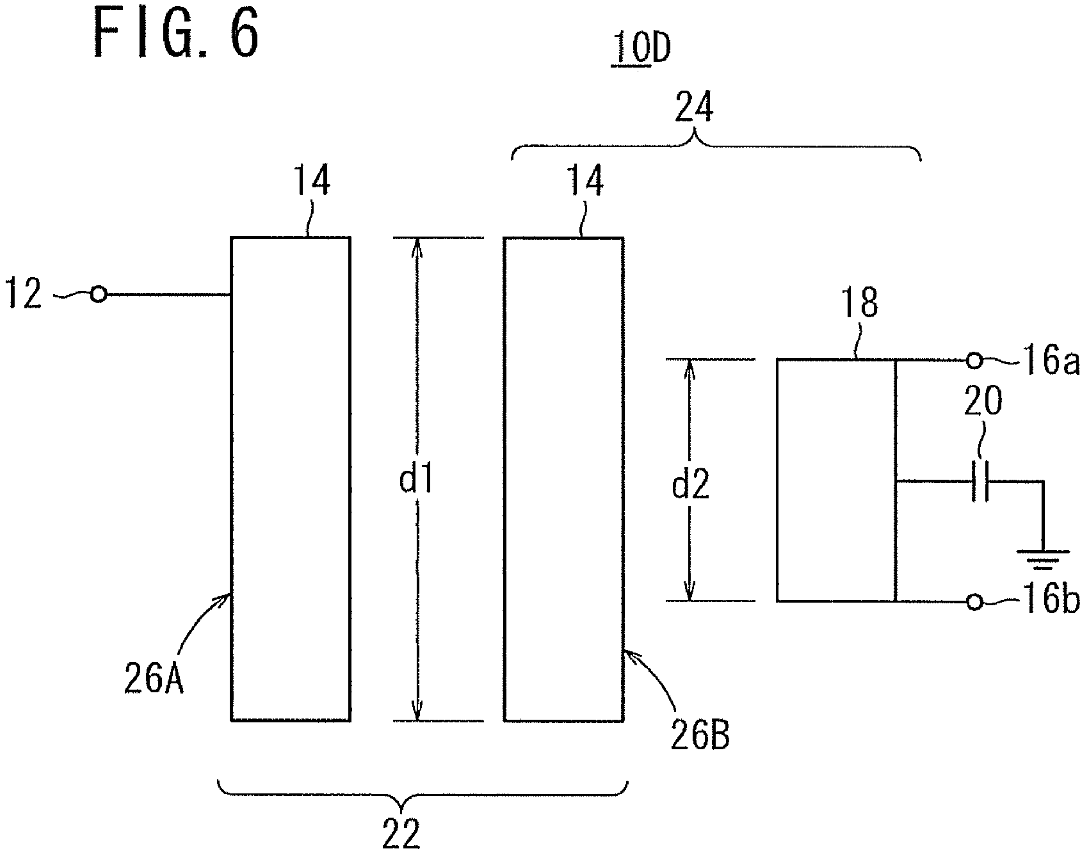
FIG. 6 is a view showing a fourth passive component.

As shown in FIG. 6, the fourth passive component 10D is substantially identical in structure to the third passive component 10C, but is different therefrom in that the filter section 22 has an input resonator 26A and an output resonator 26B. Each of the input resonator 26A and the output resonator 26B comprises an unbalanced line 14 having an electric length λ/2.

The balun 24 includes the unbalanced line 14 of the output resonator 26B of the filter section 22, a balanced line 18 disposed in confronting relation to the unbalanced line 14, and a capacitor 20 occurring between the balanced line 18 and the fixed potential. In the fourth passive component 10D, if the unbalanced line 14 of the output resonator 26B has a physical length d1 and the balanced line 18 has a physical length d2, then the physical lengths d1, d2 are related to each other as follows:

$$d1>d2$$

With the fourth passive component 10D, it is possible to provide a phase difference of 180 degrees between signals output from the first balanced output terminal 16*a* and the second balanced output terminal 16*b*. Furthermore, since the output resonator 26B of the filter section 22 can also function as the unbalanced line 14 of the balun 24, the fourth passive component 10D is effectively reduced in size and effectively reduces the loss which it causes.

A passive component according to a fifth exemplary embodiment (hereinafter referred to as "fifth passive component 10E") will be described below with reference to FIG. 7.

Figure 7:
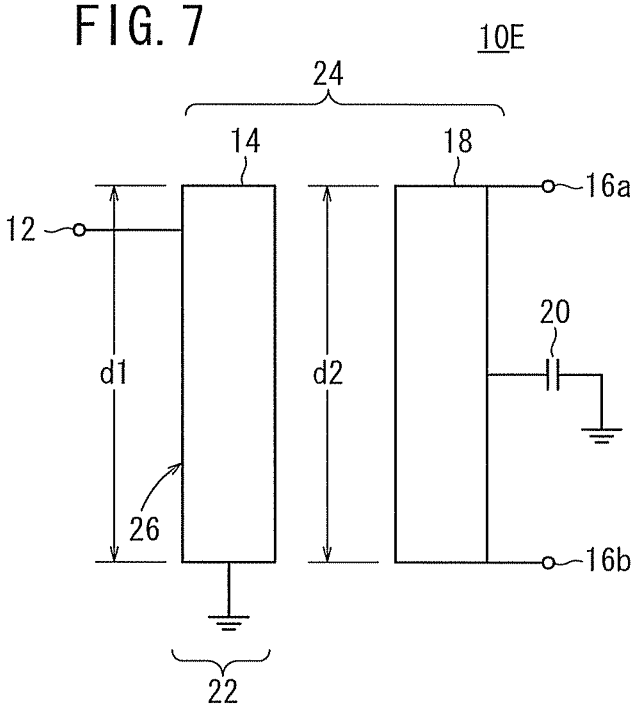
FIG. 7 is a view showing a fifth passive component.

As shown in FIG. 7, the fifth passive component 10E is substantially identical in structure to the third passive component 10C, but is different therefrom in that the resonator 26 of the filter section 22 comprises an unbalanced line 14 having an electric length λ/4 and the physical length d2 of the balanced line 18 is substantially the same as the physical length d1 of the unbalanced line 14.

With the fifth passive component 10E, as with the second passive component 10B, it is possible to provide a phase difference of 180 degrees between signals output from the first balanced output terminal 16*a* and the second balanced output terminal 16*b*. Furthermore, by appropriately setting the value of the capacitor 20, the yield (increasing the productivity) of fifth passive components 10E can be increased, and the cost of the fifth passive component 10E can be reduced.

A passive component according to a sixth exemplary embodiment (hereinafter referred to as "sixth passive component 10F") will be described below with reference to FIG. 8.

Figure 8:
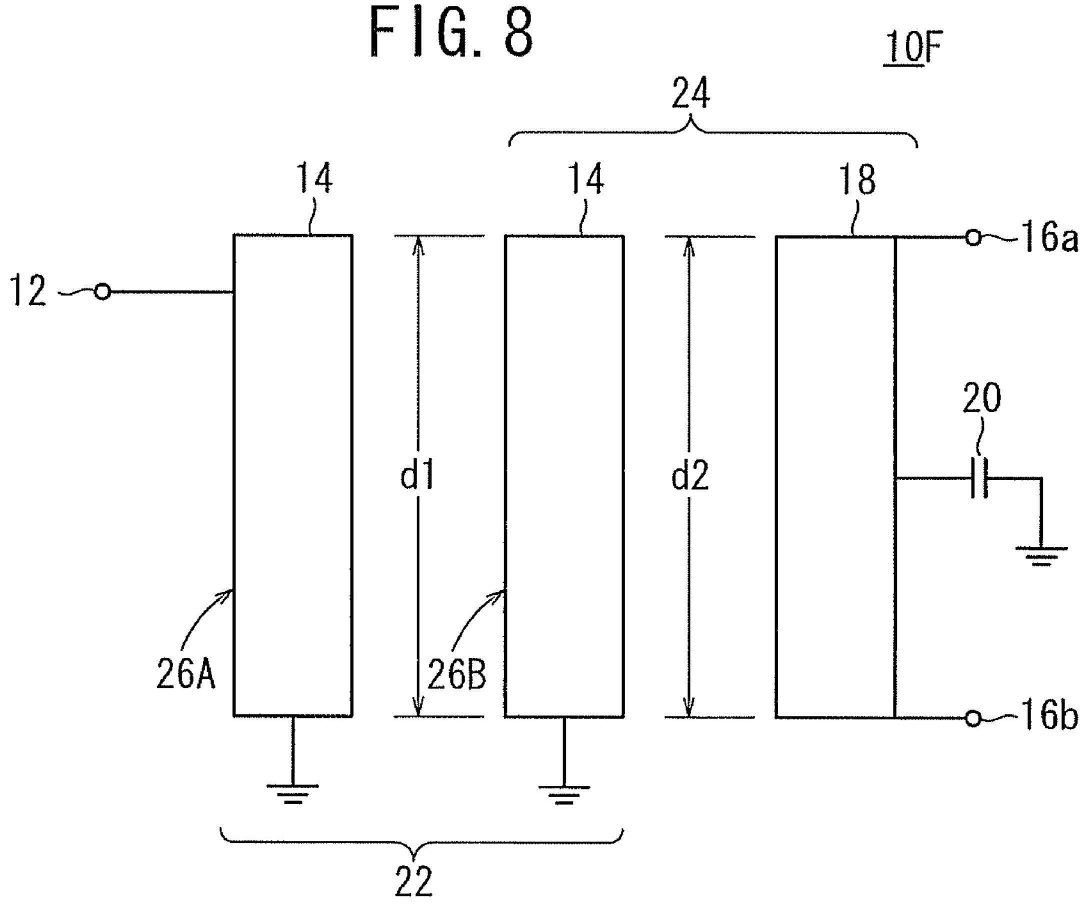
FIG. 8 is a view showing a sixth passive component.

As shown in FIG. 8, the sixth passive component 10F is substantially identical in structure to the fifth passive component 10E, but is different therefrom in that the filter section 22 has an input resonator 26A and an output resonator 26B. Each of the input resonator 26A and the output resonator 26B comprises an unbalanced line 14 having an electric length λ/4.

The balun 24 includes the unbalanced line 14 of the output resonator 26B of the filter section 22, a balanced line 18 disposed in confronting relation to the unbalanced line 14, and a capacitor 20 occurring between the balanced line 18 and the fixed potential.

With the sixth passive component 10F, it is possible to provide a phase difference of 180 degrees between signals output from the first balanced output terminal 16*a* and the second balanced output terminal 16*b*. Furthermore, since the output resonator 26B of the filter section 22 can also function as the unbalanced line 14 of the balun 24, the sixth passive component 1OF is effectively reduced in size and effectively reduces the loss which it causes.

In the fourth passive component and the sixth passive component, the resonators of the filter section include the input resonator and the output resonator. However, the resonators of the filter section may further include one or more resonators between the input resonator and the output resonator.

Specific examples (embodiments) of the above various exemplary embodiments will be described below with reference to FIGS. 9 through 19.

[Embodiment 1]

Figure 9:
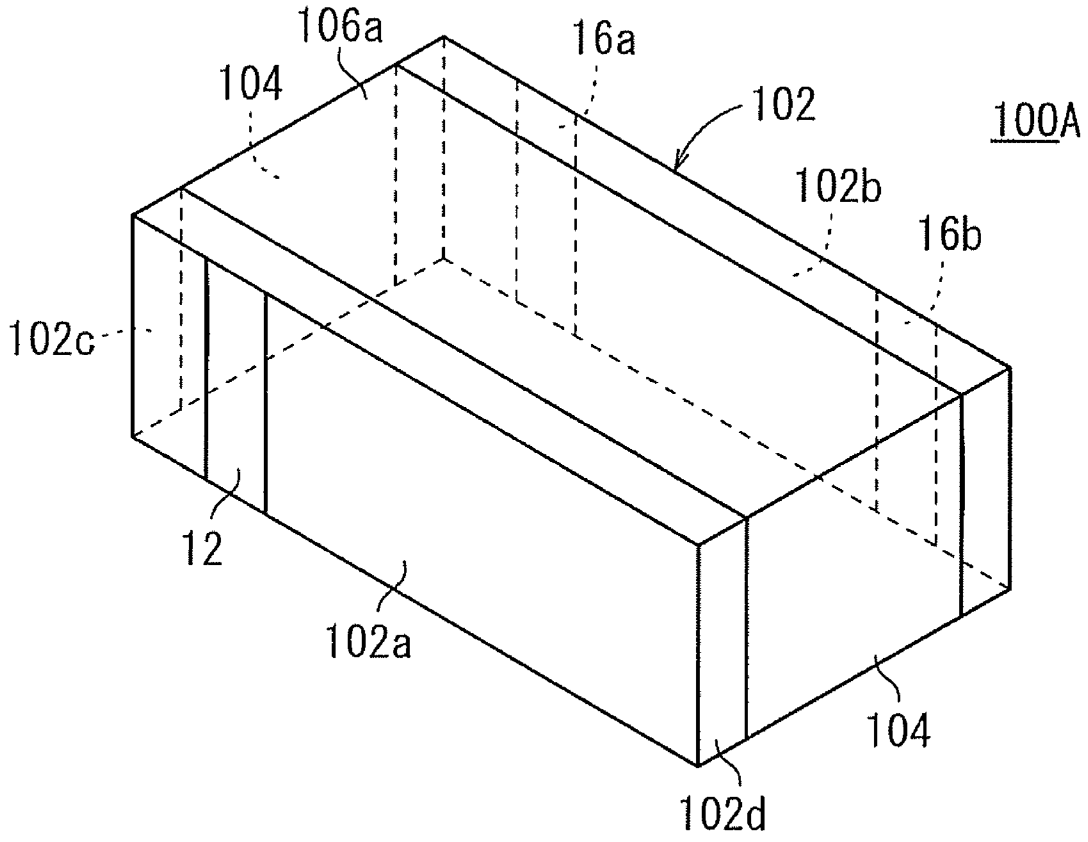
FIG. 9 is a perspective view showing the appearance of a first balun.

A balun according to Embodiment 1 (hereinafter referred to as "first balun 100A") represents a first specific example of the second passive component 10B. As shown in FIG. 9, the first balun 100A has a dielectric substrate 102 comprising a plurality of dielectric layers stacked and sintered together. The dielectric substrate 102 has outer surfaces including a first side surface 102*a* with an unbalanced input terminal 12 disposed thereon, a second side surface 102*b* (a side surface facing the first side surface 102*a*) with two balanced output terminals (a first balanced output terminal 16*a* and a second balanced output terminal 16*b*) disposed thereon, and a third side surface 102*c* and a fourth side surface 102*d* with shield terminals 104 disposed respectively thereon.

Figure 10:
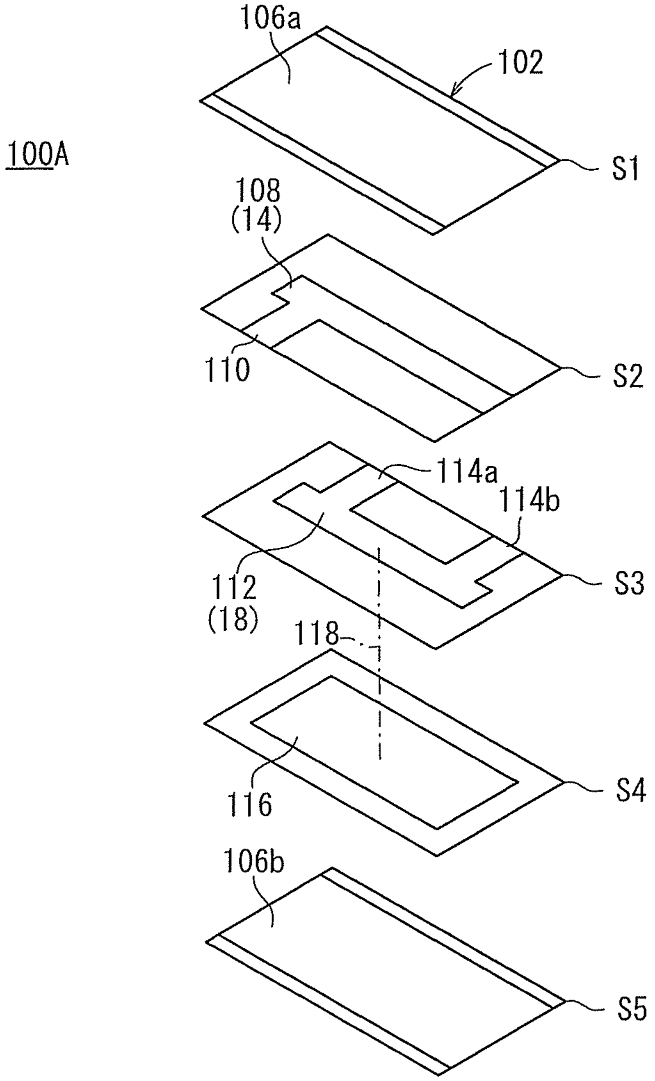
FIG. 10 is an exploded perspective view showing the structure of the first balun.

As shown in FIG. 10, the dielectric substrate 102 comprises first through fifth dielectric layers S1 through S5 which are stacked successively from above. Each of the first through fifth dielectric layers S1-S5 comprises a single layer or a plurality of layers.

The first balun 100A includes an upper shield electrode 106*a* disposed on an upper end of the dielectric substrate 102 and a lower shield electrode 106*b* disposed on a lower end of the dielectric substrate 102. Specifically, the upper shield electrode 106*a* is disposed on a principal surface of the first dielectric layer S1, and the lower shield electrode 106*b* is disposed on a principal surface of the fifth dielectric layer S5. The upper shield electrode 106*a* and the lower shield electrode 106*b* are connected to the shield terminals 104.

The first balun 100A also includes a first stripline electrode 108 disposed on a principal surface of the second dielectric layer S2 and serving as the unbalanced line 14. The first stripline electrode 108 includes, at a position near an end thereof (open end), a lead electrode 110 connected to the unbalanced input terminal 12, and has the other end (short-circuited end) connected to one of the shield terminals 104.

The first balun 100A also includes a second stripline electrode 112 disposed on a principal surface of the third dielectric layer S3 at a position facing the first stripline electrode 108 and serving as the balanced line 18. The second stripline electrode 112 includes, at a position near an end thereof (open end), a first lead electrode 114*a* connected to the first balanced output terminal 16*a*, and also includes, at a position near the other end thereof, a second lead electrode 114*b* connected to the second balanced output terminal 16*b*.

The first balun 100A also includes a capacitor-forming electrode 116 disposed on a principal surface of the fourth dielectric layer S4 and forming a capacitor 20 between the second stripline electrode 112 and the lower shield electrode 106*b*. The capacitor-forming electrode 116 is disposed in confronting relation to the second stripline electrode 112 and the lower shield electrode 106*b*, and is connected to a longitudinally central portion of the second stripline electrode 112 through a via hole 118 that is defined in the third dielectric layer S3.

If the value of the capacitor 20 between the second stripline electrode 112 and the lower shield electrode 106*b* is to be changed, then the dielectric constant or thickness of the fourth dielectric layer S4 may be changed or the area of the capacitor-forming electrode 116 may be changed.

If the phase difference and balanced characteristics between balanced output signals from the first balanced output terminal 16*a* and the second balanced output terminal 16*b* are to be changed, then the position of the via hole 118 defined in the third dielectric layer S3 may be changed.

[Embodiment 2]

Figure 11:
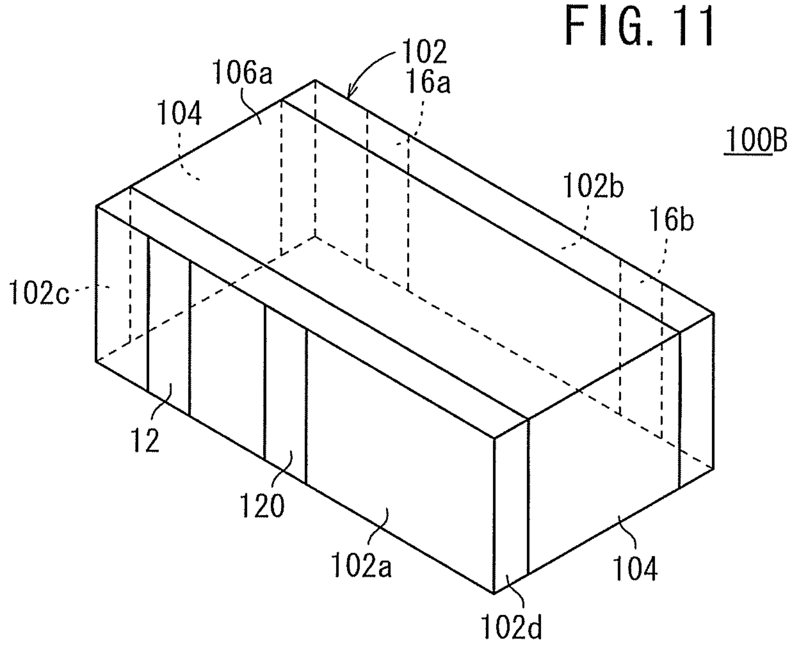
FIG. 11 is a perspective view showing the appearance of a second balun.

A balun according to Embodiment 2 (hereinafter referred to as "second balun 100B") represents a second specific example of the second passive component 10B. The second balun 100B is of substantially the same structure as the first balun 100A, but is different therefrom as follows:

As shown in FIG. 11, the second balun 100B includes an unbalanced input terminal 12 and a DC voltage input terminal (DC input terminal 120) which are disposed on the first side surface 102*a* among the outer surfaces of the dielectric substrate 102.

Figure 12:
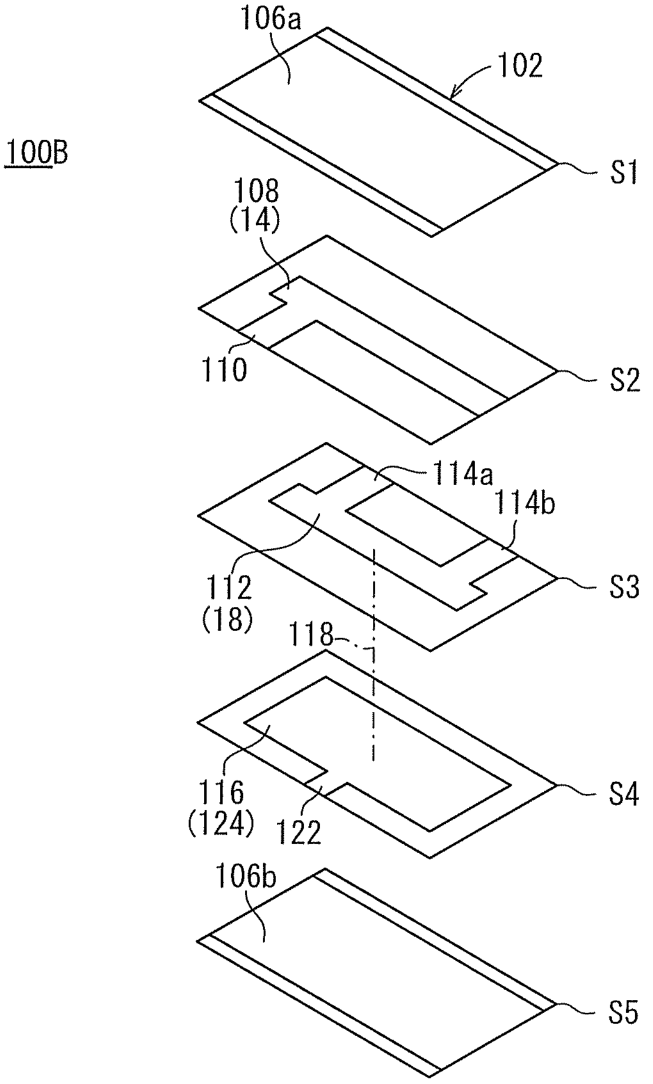
FIG. 12 is an exploded perspective view showing the structure of the second balun.

As shown in FIG. 12, the capacitor-forming electrode 116 is connected to the DC input terminal 120 through a lead electrode 122, and also functions as an electrode (DC electrode 124) to which a DC voltage is applied. Therefore, the first balanced output terminal 16*a* and the second balanced output terminal 16*b* output balanced output signals including the DC voltage applied to the DC electrode 124 as a bias voltage.

[Embodiment 3]

Figure 13:
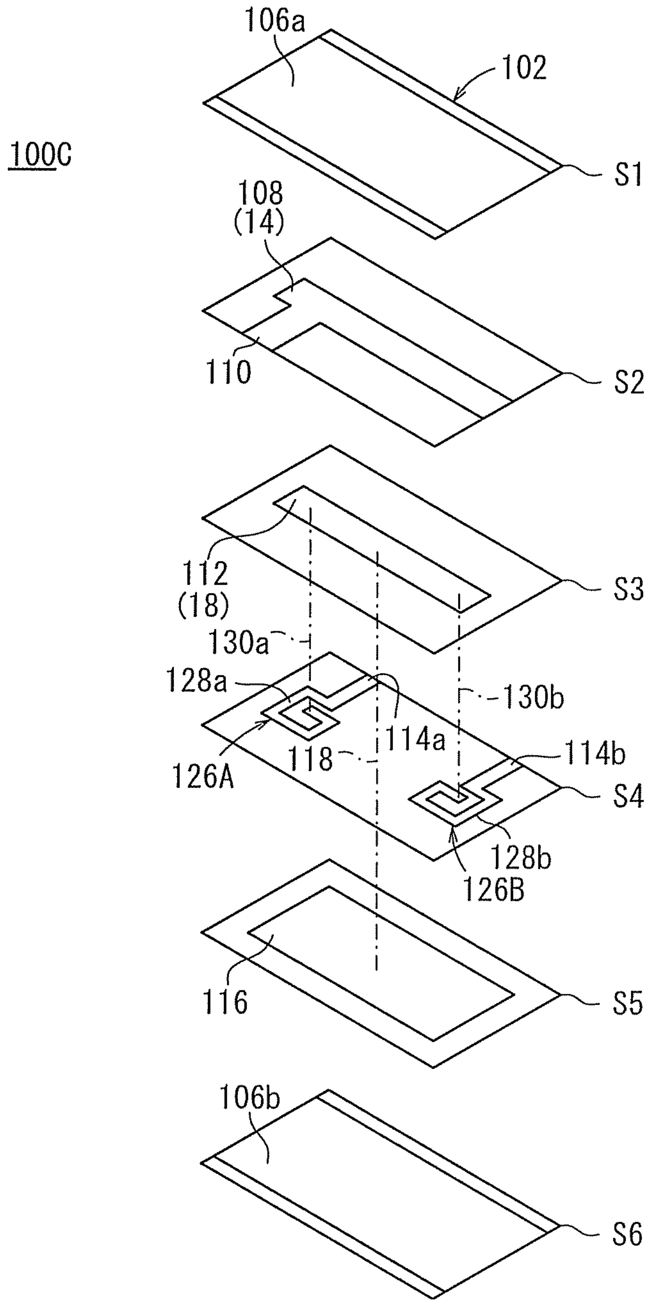
FIG. 13 is an exploded perspective view showing the structure of a third balun.

A balun according to Embodiment 3 (hereinafter referred to as "third balun 100C") represents a third specific example of the second passive component. The third balun 100C is of substantially the same structure as the first balun 100A, but is different therefrom as follows:

As shown in FIG. 13, the dielectric substrate 102 comprises first through sixth dielectric layers S1 through S6 which are stacked successively from above.

The second stripline electrode 112 is disposed on the principal surface of the third dielectric layer S3. A first matching circuit element 126A and a second matching circuit element 126B for matching the output impedance with the input impedance of an external circuit are disposed on the principal surface of the fourth dielectric layer S4.

The first matching circuit element 126A includes a first inductance electrode 128*a* having a spiral shape and a first lead electrode 114*a* which connects the first inductance electrode 128*a* to the first balanced output terminal 16*a*. The first inductance electrode 128*a* is connected to the second stripline electrode 112 through a first via hole 130*a* defined in the third dielectric layer S3.

Similarly, the second matching circuit element 126B includes a second inductance electrode 128*b* having a spiral shape and a second lead electrode 114*b* which connects the second inductance electrode 128*b* to the second balanced output terminal 16*b*. The second inductance electrode 128*b* is connected to the second stripline electrode 112 through a second via hole 130*b* defined in the third dielectric layer S3.

The capacitor-forming electrode 116 is disposed on the principal surface of the fifth dielectric layer S5. The lower shield electrode 106*b* is disposed on a principal surface of the sixth dielectric layer S6.

If the phase difference and balanced characteristics between balanced output signals from the first balanced output terminal 16*a* and the second balanced output terminal 16*b* are to be changed, then the position of the via hole 118 which is defined in the third dielectric layer S3 and the fourth dielectric layer S4 may be changed.

[Embodiment 4]

Figure 14:
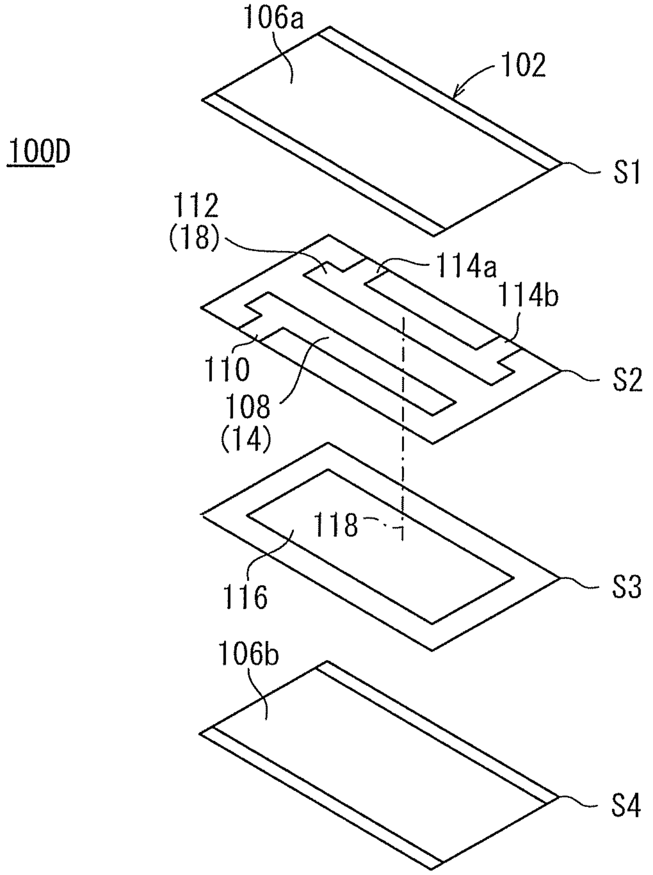
FIG. 14 is an exploded perspective view showing the structure of a fourth balun.

A balun according to Embodiment 4 (hereinafter referred to as "fourth balun 100D") represents a fourth specific example of the second passive component 10B. The fourth balun 100D is of substantially the same structure as the first balun 100A, but is different therefrom as follows:

As shown in FIG. 14, the dielectric substrate 102 comprises first through fourth dielectric layers S1 through S4 which are stacked successively from above.

The first stripline electrode 108 and the second stripline electrode 112 are disposed on the principal surface of the second dielectric layer S2. The capacitor-forming electrode 116 is disposed on the principal surface of the fourth dielectric layer S4.

The fourth balun 100D is of a structure that is advantageous to make itself low in profile though the coupling between the striplines is somewhat weak, because the first stripline electrode 108 and the second stripline electrode 112 are disposed on the same surface (the principal surface of the second dielectric layer S2).

[Embodiment 5]

Figure 15:
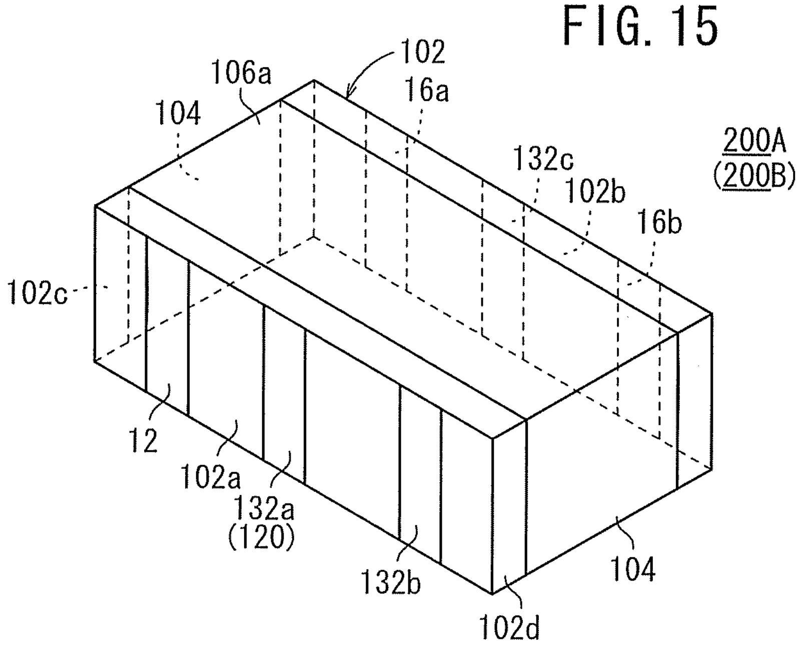
FIG. 15 is a perspective view showing the appearance of a first filter (and a second filter)

A filter according to Embodiment 5 (hereinafter referred to as "first filter 200A") represents a first specific example of the sixth passive component 10F. As shown in FIG. 15, the dielectric substrate 102 has outer surfaces including a first side surface 102*a* with an unbalanced input terminal 12, a first NC terminal 132*a*, and a second NC terminal 132*b* disposed thereon, a second side surface 102*b* (a side surface facing the first side surface 102*a*) with two balanced output terminals (a first balanced output terminal 16*a* and a second balanced output terminal 16*b*) and a third NC terminal 132*c* disposed thereon, and a third side surface 102*c* and a fourth side surface 102*d* with shield terminals 104 disposed respectively thereon.

Figure 16:
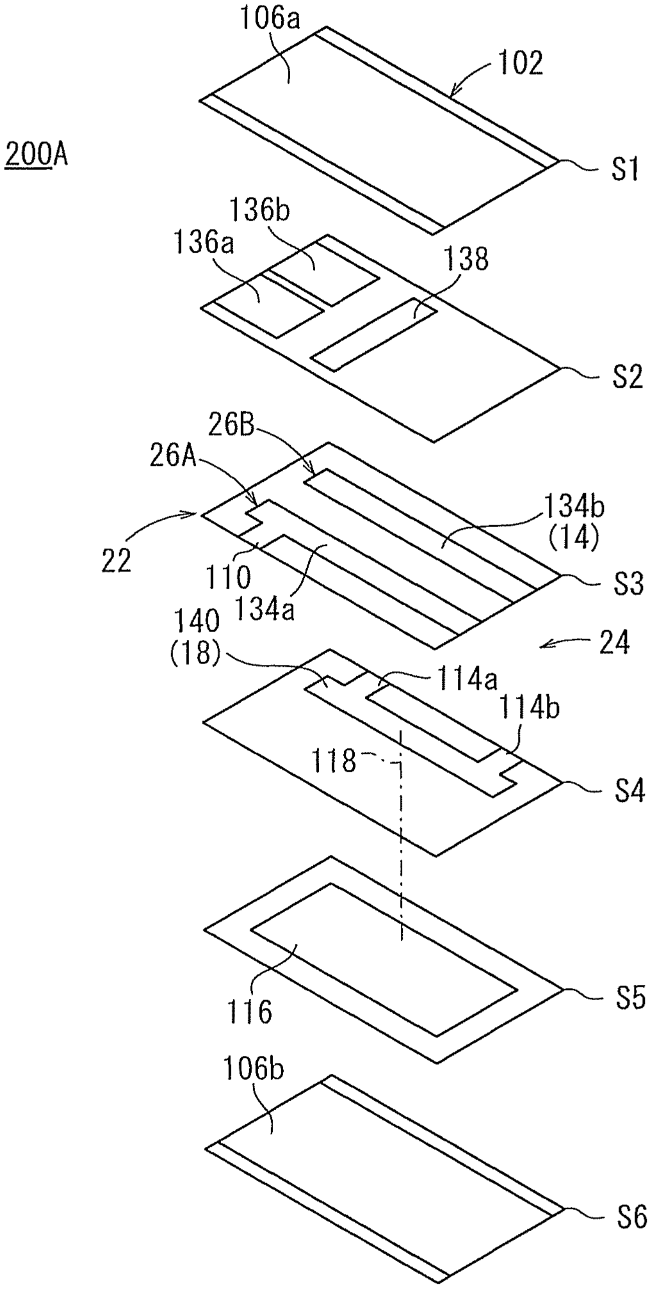
FIG. 16 is an exploded perspective view showing the structure of the first filter.

As shown in FIG. 16, the dielectric substrate 102 comprises first through sixth dielectric layers S1 through S6 which are stacked successively from above.

The upper shield electrode 106*a* is disposed on a principal surface of the first dielectric layer S1, and the lower shield electrode 106*b* is disposed on a principal surface of the sixth dielectric layer S6. The upper shield electrode 106*a* and the lower shield electrode 106*b* are connected to the shield terminals 104.

An input resonance electrode 134*a* of the input resonator 26A of the filter section 22 and an output resonance electrode 134*b* of the output resonator 26B of the filter section 22 are disposed on the principal surface of the third dielectric layer S3. The input resonance electrode 134*a* includes, at a position near an end thereof (open end), a lead electrode 110 connected to the unbalanced input terminal 12, and has the other end (short-circuited end) connected to one of the shield terminals 104. The output resonance electrode 134*b* has the other end (short-circuited end) connected to the same shield terminal 104.

A first inner-layer shield electrode 136*a* is disposed on the principal surface of the second dielectric layer S2 at a position facing the open end of the input resonance electrode 134*a*. A second inner-layer shield electrode 136*b* is disposed on the principal surface of the second dielectric layer S2 at a position facing the open end of the output resonance electrode 134*b*. A coupling adjusting electrode 138 for adjusting the coupling between the input resonator 26A and the output resonator 26B is disposed on the principal surface of the second dielectric layer S2.

A stripline electrode 140 of the balanced line 18 of the balun 24 is disposed on the principal surface of the fourth dielectric layer S4 at a position facing the output resonance electrode 134*b*. The stripline electrode 140 includes, at a position near an end thereof (open end), a first lead electrode 114*a* connected to the first balanced output terminal 16*a*, and also includes, at a position near the other end thereof, a second lead electrode 114*b* connected to the second balanced output terminal 16*b*.

The first filter 200A also includes a capacitor-forming electrode 116 disposed on the principal surface of the fifth dielectric layer S5 and forming a capacitor 20 between the stripline electrode 140 and the lower shield electrode 106*b*. The capacitor-forming electrode 116 is disposed in confronting relation to the stripline electrode 140 and the lower shield electrode 106*b*, and is connected to a longitudinally central portion of the stripline electrode 140 through a via hole 118 that is defined in the fourth dielectric layer S4.

If the value of the capacitor 20 between the stripline electrode 140 and the lower shield electrode 106*b* is to be changed, then the dielectric constant or thickness of the fifth dielectric layer S5 may be changed or the area of the capacitor-forming electrode 116 may be changed.

If the phase difference and balanced characteristics between balanced output signals from the first balanced output terminal 16*a* and the second balanced output terminal 16*b* are to be changed, then the position of the via hole 118 defined in the fourth dielectric layer S4 may be changed.

[Embodiment 6]

A filter according to Embodiment 6 (hereinafter referred to as "second filter 200B") represents a second specific example of the sixth passive component 10F. The second filter 200B is of substantially the same structure as the first filter 200A, but is different therefrom as follows:

As shown in FIG. 15, a DC voltage input terminal (DC input terminal 120) is disposed, in place of the first NC terminal 132*a*, on the first side surface 102*a* among the outer surfaces of the dielectric substrate 102.

Figure 17:
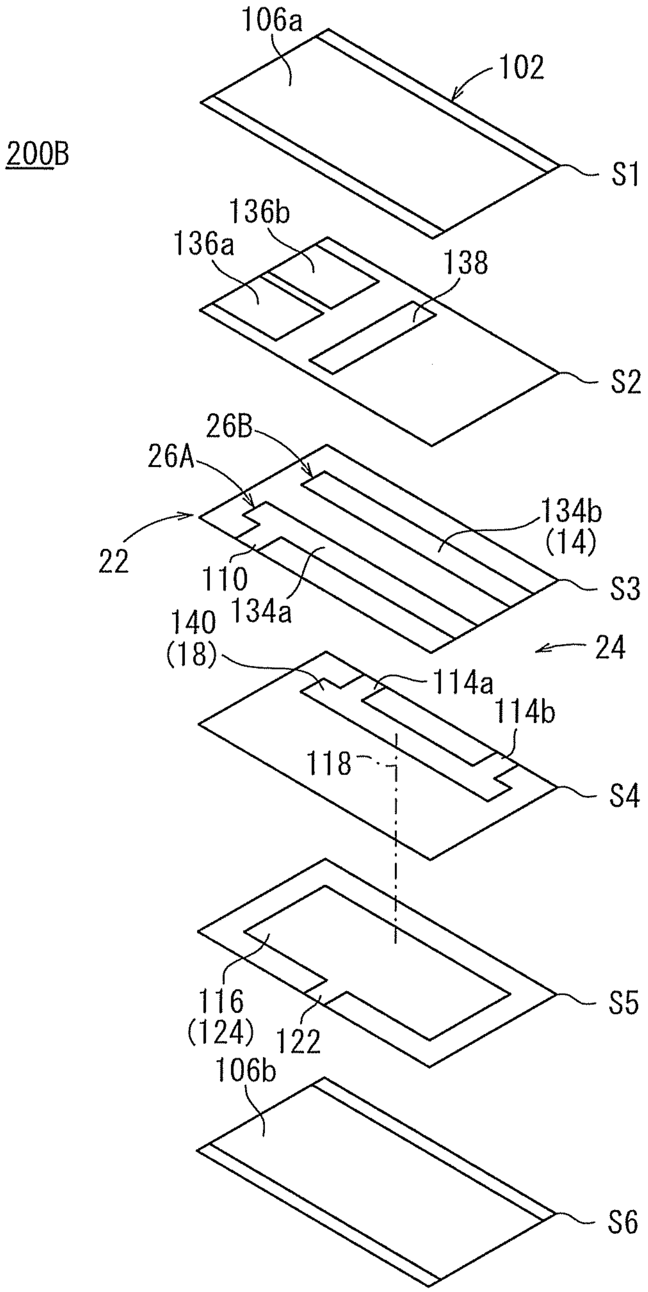
FIG. 17 is an exploded perspective view showing the structure of the second filter.

As shown in FIG. 17, the capacitor-forming electrode 116 is connected to the DC input terminal 120 through a lead electrode 122, and also functions as an electrode (DC electrode 124) to which a DC voltage is applied. Therefore, the first balanced output terminal 16*a* and the second balanced output terminal 16*b* output balanced output signals including the DC voltage applied to the DC electrode 124 as a bias voltage.

[Embodiment 7]

Figure 18:
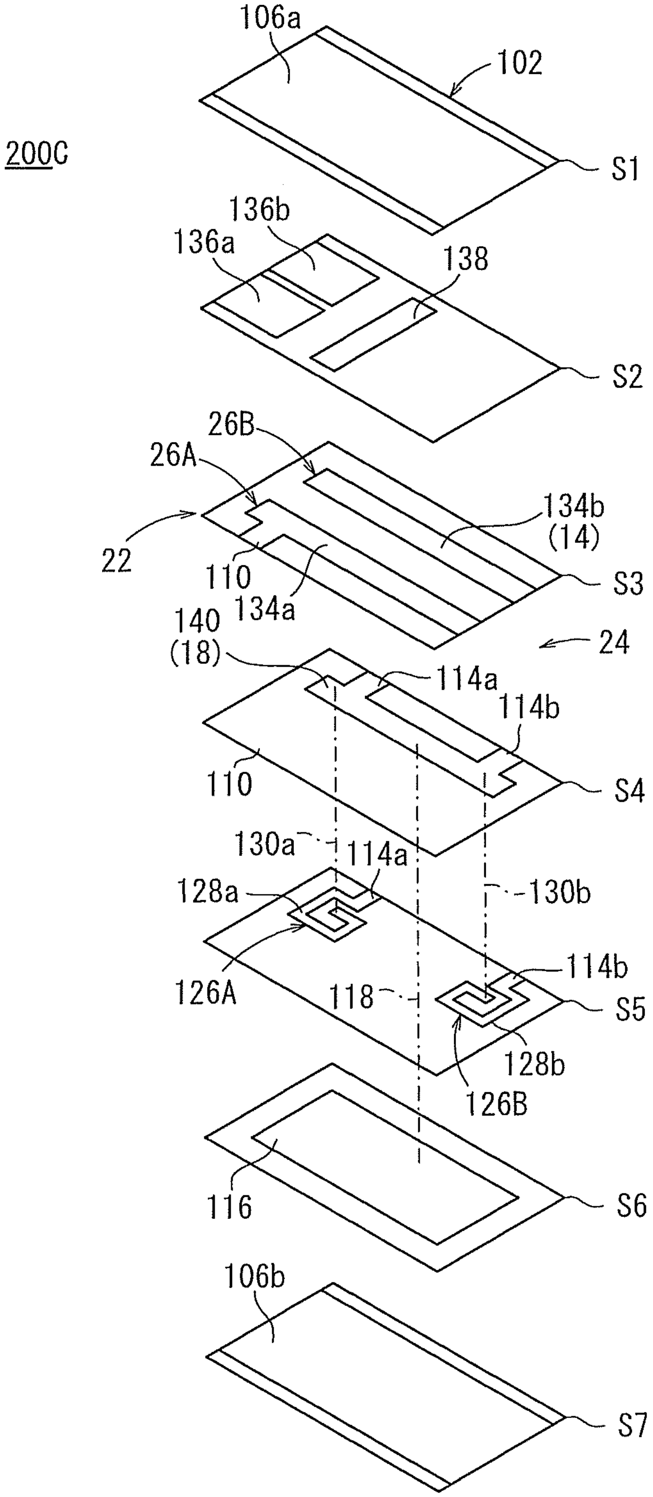
FIG. 18 is an exploded perspective view showing the structure of a third filter.

A filter according to Embodiment 7 (hereinafter referred to as "third filter 200C") represents a third specific example of the sixth passive component 10F. The third filter 200C is of substantially the same structure as the first filter 200A, but is different therefrom as follows:

As shown in FIG. 18, the dielectric substrate 102 comprises first through seventh dielectric layers S1 through S7 which are stacked successively from above.

The stripline electrode 140 is disposed on the principal surface of the fourth dielectric layer S4. The first matching circuit element 126A and the second matching circuit element 126B for matching the output impedance with the input impedance of an external circuit are disposed on the principal surface of the fifth dielectric layer S5. The first matching circuit element 126A and the second matching circuit element 126B will not be described in detail below as their structures have already been described above.

The capacitor-forming electrode 116 is disposed on the principal surface of the sixth dielectric layer S6. The lower shield electrode 106*b* is disposed on a principal surface of the seventh dielectric layer S7.

If the phase difference and balanced characteristics between balanced output signals from the first balanced output terminal 16*a* and the second balanced output terminal 16*b* are to be changed, then the position of the via hole 118 which is defined in the fourth dielectric layer S4 and the fifth dielectric layer S5 may be changed.

[Embodiment 8]

Figure 19:
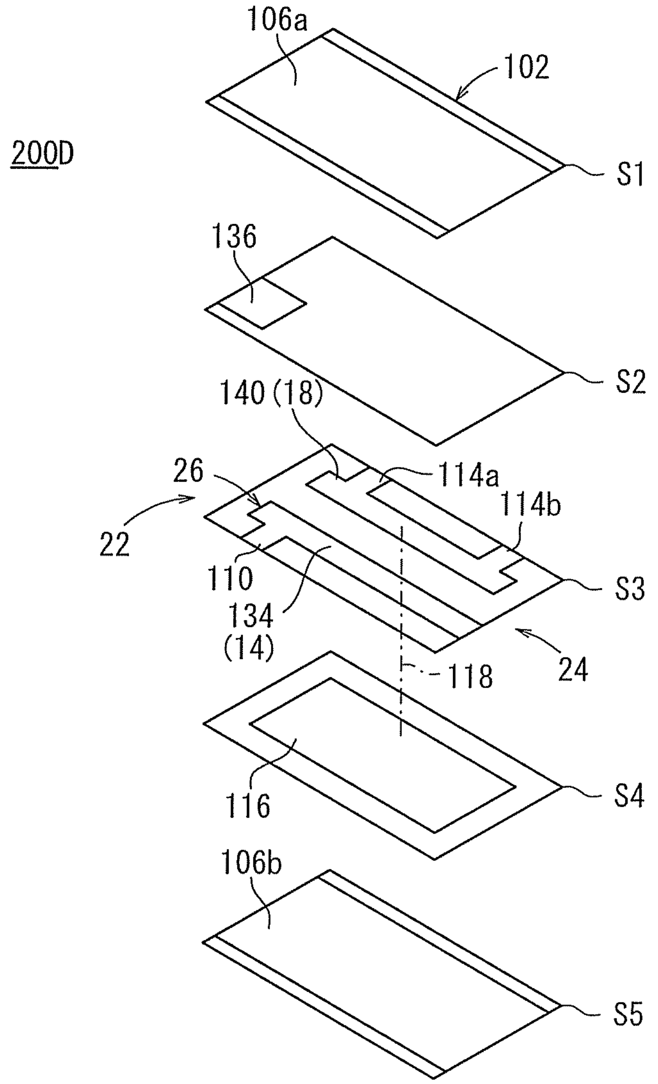
FIG. 19 is an exploded perspective view showing the structure of the fourth filter.

A filter according to Embodiment 8 (hereinafter referred to as "fourth filter 200D") represents a specific example of the fifth passive component 10E. The fourth filter 200D is of substantially the same structure as the first filter 200A, but is different therefrom as follows:

As shown in FIG. 19, the dielectric substrate 102 comprises first through fifth dielectric layers S1 through S5 which are stacked successively from above.

A resonance electrode 134 of the resonator 26 of the filter section 22 and the stripline electrode 140 of the balanced line 18 of the balun 24 are disposed on the principal surface of the third dielectric layer S3. An inner-layer shield electrode 136 is disposed on the principal surface of the second dielectric layer S2 at a position facing the open end of the resonance electrode 134. The capacitor-forming electrode 116 is disposed on the principal surface of the fourth dielectric layer S4, and the lower shield electrode 106*b* is disposed on the principal surface of the fifth dielectric layer S5.

The fourth filter 200D is of a structure that is advantageous to make itself low in profile though the coupling between the resonance electrode 134 and the stripline electrode 140 is somewhat weak, because the resonance electrode 134 and the stripline electrode 140 are disposed on the same surface (the principal surface of the third dielectric layer S3).

The passive components according to the present invention are not limited to the above exemplary embodiments. Rather, the passive components may incorporate various structural details without departing from the scope of the present invention.

The invention claimed is:

1. A passive component comprising:

an unbalanced line;

a balanced line disposed in confronting relation to the unbalanced line; and a capacitor occurring between the balanced line and a fixed potential, wherein the unbalanced line has a physical length d1 and the balanced line has a physical length d2, and the physical lengths are related to each other as follows:

$$d1>d2, \text{ and}$$

wherein the balanced line has a first balanced output terminal connected to one end of the balanced line, a second balanced output terminal connected to an opposing end of the balanced line, and the capacitor connected to the balanced line between the first balanced output terminal and the second balanced output terminal.

2. The passive component according to claim 1, further comprising:

a dielectric substrate with an upper shield electrode and/or a lower shield electrode disposed thereon;

a first stripline electrode disposed in the dielectric substrate and serving as the unbalanced line;

a second stripline electrode disposed in the dielectric substrate and serving as the balanced line; and a capacitor-forming electrode disposed in the dielectric substrate and forming the capacitor between itself and the second stripline electrode;

wherein the capacitor-forming electrode is connected to the second stripline electrode at a position adjusted for phase difference and balanced characteristics of balanced output.

3. The passive component according to claim 2, wherein the first stripline electrode and the second stripline electrode are disposed on different surfaces, respectively.

4. The passive component according to claim 2, wherein the first stripline electrode and the second stripline electrode are disposed on one surface.

5. The passive component according to claim 2, wherein the capacitor-forming electrode is disposed between the second stripline electrode and the upper shield electrode or the lower shield electrode in confronting relation to the second stripline electrode and the upper shield electrode or the lower shield electrode; and the fixed potential comprises a ground potential.

6. The passive component according to claim 2, wherein the capacitor-forming electrode is disposed between the second stripline electrode and the upper shield electrode or the lower shield electrode in confronting relation to the second stripline electrode and the upper shield electrode or the lower shield electrode, and is clamped to a DC potential different from a ground potential; and the fixed potential comprises the DC potential.

7. A passive component comprising:

a filter section having at least one resonator; and an unbalanced to balanced converter for converting an unbalanced output signal from at least the filter section into a balanced output signal;

wherein the unbalanced to balanced converter comprises:

a resonator of the filter section;

a balanced line disposed in confronting relation to the resonator; and a capacitor occurring between the balanced line and a fixed potential, wherein the resonator includes an unbalanced line having a physical length d1 and the balanced line has a physical length d2, and the physical lengths are related to each other as follows:

$$d1>d2.$$

8. The passive component according to claim 7, further comprising:

a dielectric substrate with an upper shield electrode and/or a lower shield electrode disposed thereon;

a resonance electrode of the resonator which is disposed in the dielectric substrate;

a stripline electrode disposed in the dielectric substrate and serving as the balanced line; and a capacitor-forming electrode disposed in the dielectric substrate and forming the capacitor between itself and the second stripline electrode;

wherein the capacitor-forming electrode is connected to the stripline electrode at a position adjusted for phase difference and balanced characteristics of balanced output.

9. The passive component according to claim 8, wherein the resonance electrode and the stripline electrode are disposed on different surfaces, respectively.

10. The passive component according to claim 8, wherein the resonance electrode and the stripline electrode are disposed on one surface.

11. The passive component according to claim 8, wherein the capacitor-forming electrode is disposed between the stripline electrode and the upper shield electrode or the lower shield electrode in confronting relation to the stripline electrode and the upper shield electrode or the lower shield electrode; and the fixed potential comprises a ground potential.

12. The passive component according to claim 8, wherein the capacitor-forming electrode is disposed between the stripline electrode and the upper shield electrode or the lower shield electrode in confronting relation to the stripline electrode and the upper shield electrode or the lower shield electrode, and is clamped to a DC potential different from a ground potential; and the fixed potential comprises the DC potential.

13. A passive component comprising:

a filter section having at least one resonator; and an unbalanced to balanced converter for converting an unbalanced output signal from at least the filter section into a balanced output signal;

wherein the unbalanced to balanced converter comprises:

a resonator of the filter section;

a balanced line disposed in confronting relation to the resonator; and a capacitor occurring between the balanced line and a fixed potential, wherein the resonator includes an unbalanced line having a physical length d1 and the balanced line has a physical length d2, and the physical lengths are related to each other as follows:

$$d1>d2, \text{ and}$$

wherein the balanced line has a first balanced output terminal connected to one end of the balanced line, a second balanced output terminal connected to an opposing end of the balanced line, and the capacitor connected to the balanced line between the first balanced output terminal and the second balanced output terminal.

* * * * *